United States Patent [19]

Gazit et al.

[11] Patent Number: 5,122,504
[45] Date of Patent: Jun. 16, 1992

[54] SUPERCONDUCTING RIBBON PROCESS USING LASER HEATING

[75] Inventors: Dan Gazit, Omer, Israel; Robert S. Feigelson, Saratoga, Calif.

[73] Assignee: The Board of Trustees of the Leland Stanford Junior University, Stanford, Calif.

[21] Appl. No.: 486,042

[22] Filed: Feb. 27, 1990

[51] Int. Cl.$^5$ .............................................. C30B 11/02
[52] U.S. Cl. ............................... 505/1; 505/729; 505/739; 505/740; 156/600; 156/620.1; 156/DIG. 88
[58] Field of Search ............ 156/600, 620.1, DIG. 88; 505/1, 729, 739, 740

[56] References Cited

U.S. PATENT DOCUMENTS

| | | | |
|---|---|---|---|
| 4,036,660 | 7/1977 | Mlavsky | 156/DIG. 88 |
| 4,661,200 | 4/1987 | Sachs | 156/DIG. 88 |
| 4,689,109 | 8/1987 | Sachs | 156/DIG. 88 |
| 4,851,416 | 8/1989 | Morrison | 156/620.1 |

FOREIGN PATENT DOCUMENTS

| | | | |
|---|---|---|---|
| 64-60916 | 3/1989 | Japan | 505/740 |
| 1-144524 | 6/1989 | Japan | 505/740 |
| 1-264116 | 10/1989 | Japan | 505/740 |
| 1-264117 | 10/1989 | Japan | 505/740 |

OTHER PUBLICATIONS

Jiang et al., "Crystal Growth of Y-Ba-Cu-O Compound by Laser Floating Zone Melting", Extended Abstracts, High Temp. Super. (II) M.R.S., Apr. 1988, pp. 125-128.

Carrillo-Cabrera et al, "Preparation and Growth of (Bi,Bb)-Sr-Ca-Cu-O Superconductor Fibers", Appl. Phys. Lett. 55(10) Sep. 4, 1989 pp. 1032-1034.

Gazit et al. (I), "Growth of Bi-Based Superconducing Ribbons" Journal of Crystal Growth; vol. 98 (1989) pp. 541-544.

Gazit et al. (II), "Laser-Heated Pedestal Growth of High $T_c$ Bi-Sr-Ca-Cu-O Superconducting Fibers", Journal of Crystal Growth vol. 91 (1988) pp. 318-330.

Primary Examiner—Robert Kunemund
Attorney, Agent, or Firm—Flehr, Hohbach, Test, Albritton & Herbert

[57] ABSTRACT

A method of growing a superconducting ribbon from a molten region of a Bi-based superconducting source material using two parallel platinum support wires is described. A method of annealing the ribbon in air to reduce the quantity of nonsuperconducting phases is also described.

5 Claims, 4 Drawing Sheets

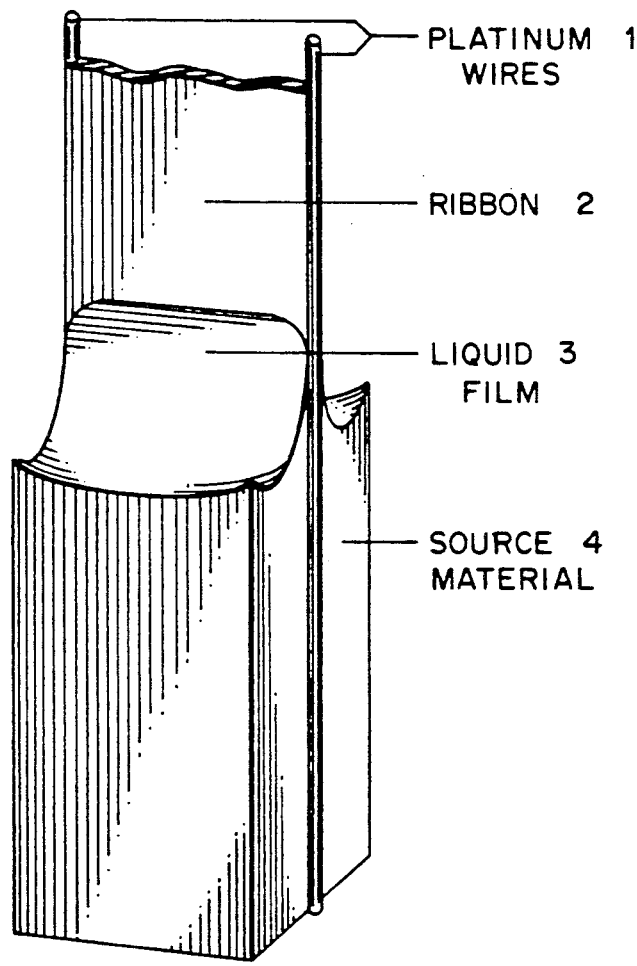
FIG.—1

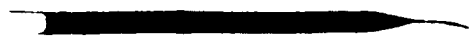
FIG.—2
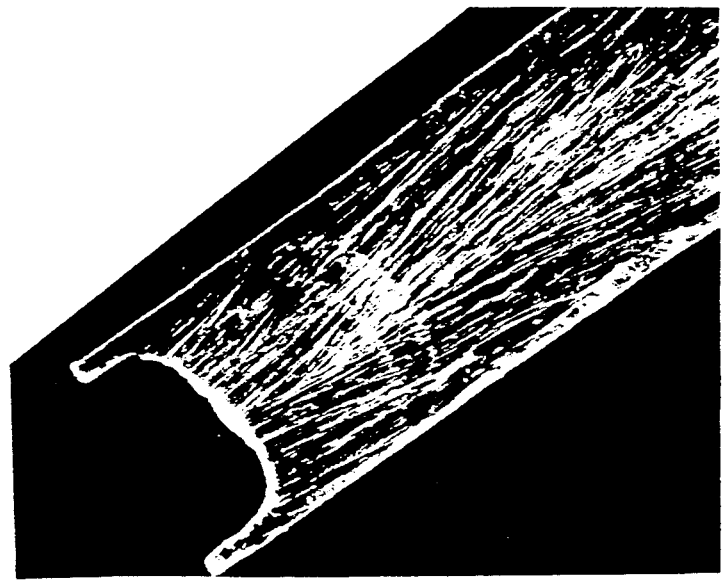
FIG.—3

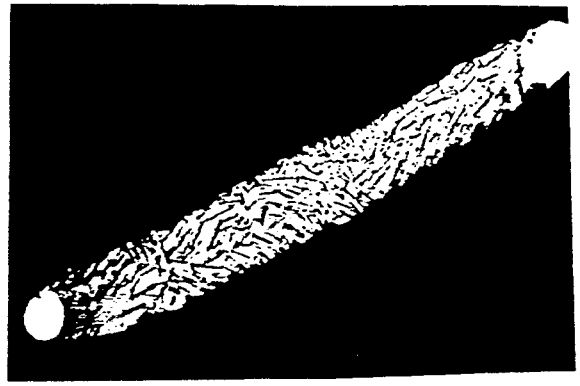
FIG.—4
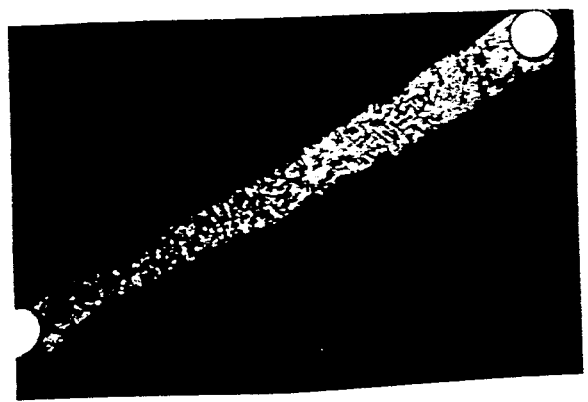
FIG.—5

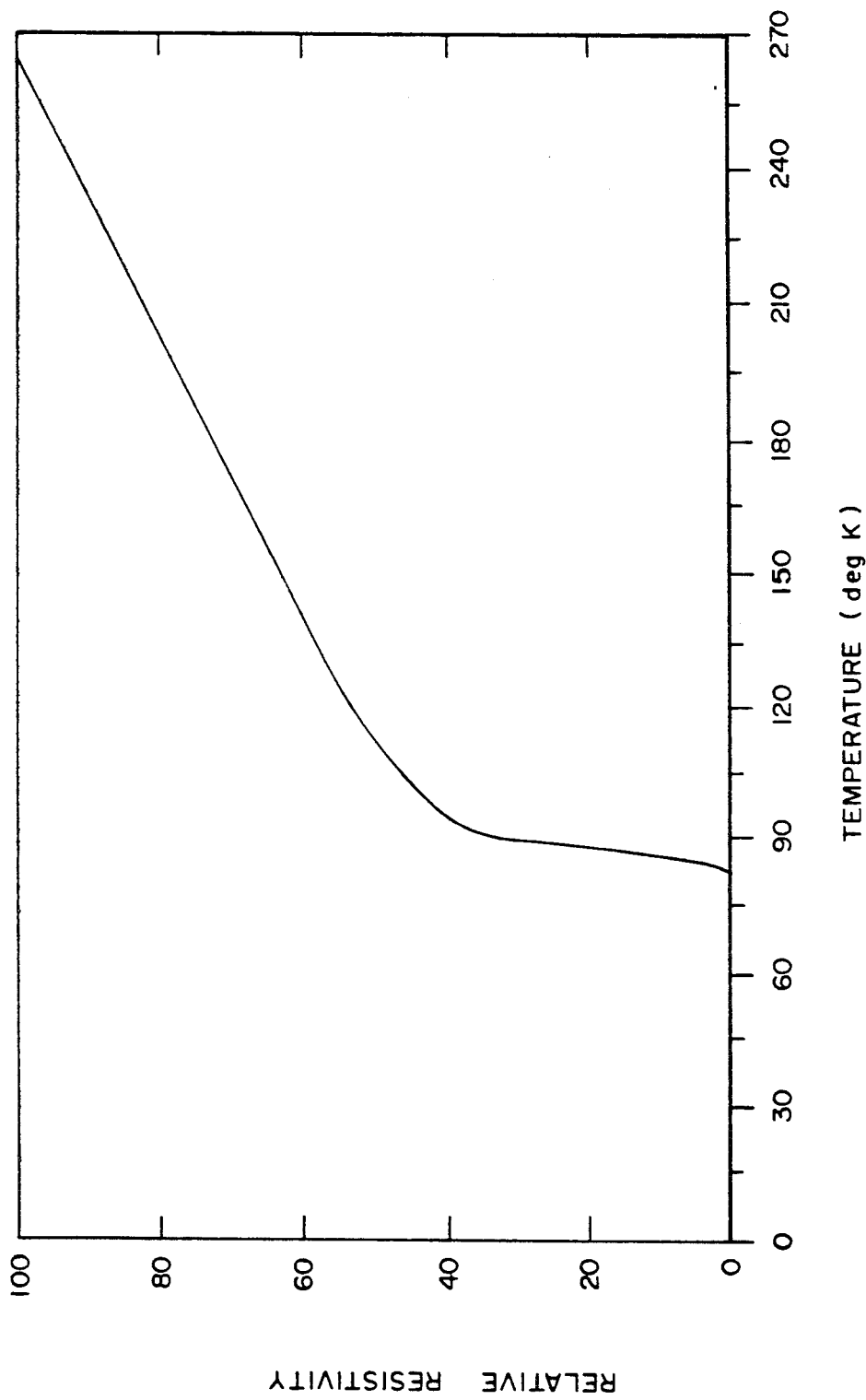
FIG.—6

SUPERCONDUCTING RIBBON PROCESS USING LASER HEATING

BRIEF DESCRIPTION OF THE INVENTION

The present invention relates generally to superconducting ribbons and to a method of growing such ribbons. More particularly, the invention relates to the method of growing a Bi-based superconducting ribbon using the laser-heated pedestal growth (LHPG) technique.

BACKGROUND OF THE INVENTION

It has been previously demonstrated that a high temperature superconductor coating on a platinum wire substrate could be produced using the laser heated pedestal growth method (LHPG).

In this work, the superconducting material was $Bi_2Sr_2CaCu_2O_8$. It was found that a layer with a thickness of only 2 micrometers adjacent to the wire reacted with the platinum, while the rest of the coating was a high temperature superconductor. This technique, with some modifications, has also been applied to growing superconducting ribbons by appropriately shaping the meniscus.

SUMMARY AND OBJECTIONS OF THE INVENTION

Accordingly, it is an object of this invention to provide a method of growing fibrous high temperature Bi-based superconducting ribbons with a highly oriented grain alignment.

It is another object of this invention to produce a Bi-based superconducting ribbon having grains of several millimeters in length to reduce the number of weak links.

It is another object of this invention to provide a method of controlling the grain orientation in the ribbon by altering the thermal geometry during the process of forming the ribbon.

It is another object of this invention to provide a method of heat treating the ribbon in air to increase the superconductivity of the ribbon.

The attainment of these and related objects are achieved by placing two support wires on opposite sides of a Bi-based superconducting source material, melting the top of the source material using an annular-focused laser beam to cause the molten material to wet the support wires, and continuously pulling said wires to cause a suspended film between the support wires to gradually solidify with new liquid film suspended beneath the suspended film.

BRIEF DESCRIPTION OF THE DRAWINGS

The foregoing and other related objects of the invention should be more readily apparent to those skilled in the art, after review of the following more detailed description of the invention, taken together with the accompanying drawings which:

FIG. 1 is a schematic drawing of the technique for preparing a Bi-based superconducting ribbon using laser heating.

FIG. 2 is a photograph of a 1.2 millimeter wide by 22 millimeter long ribbon.

FIG. 3 is an SEM micrograph of a 1.2×0.1 millimeter wide ribbon.

FIG. 4 is a backscattered electron micrograph of a cross-section of a ribbon.

FIG. 5 is a backscattered electron micrograph of a cross-section of an annealed ribbon.

FIG. 6 is a plot showing resistance versus temperature for an annealed ribbon.

DETAILED DESCRIPTION OF THE PREFERRED EMBODIMENTS

Referring to FIG. 1, the technique for preparing a superconducting ribbon using laser heating is shown. Support wires 1 are placed on opposite sides of a superconducting source material 4 having selected composition. The top of the source rod is melted using an annular-focused laser beam. The resulting molten material wets both support wires and a film 3 is suspended between the wires by surface tension. At the beginning, the platinum wires are twisted around each other to initiate the suspension of the liquid between the wires. The wires are then separated and the ribbon 2 is formed by continuously pulling the support wires upwardly, bringing the ribbon into the colder region. This causes the film suspended between the wires to solidify as new liquid is suspended beneath solidified film. The source rod is gradually pushed towards the molten region to replenish the molten material. Using this method, an long ribbon with no theoretical limit can be produced.

In one example, the source material was prepared from $Bi_2O_3$, $CaCO_3$, $SrCO_3$, and CuO powders. Appropriate amounts were mixed together, finely ground, and prepared for hot pressing in three steps. Each step consisted of firing overnight at 760° C., 820° C., and 830° C., respectively, and regrinding and mixing afterward. The powder was then hot pressed for 4.5 hours at 700° C. under a pressure of 7000 psi. From the pellets thus obtained, 1.2 mm × 1.2 mm cross-section rods were cut to be used as the source material.

Two 100 micrometer diameter platinum wires were placed along opposite sides of the source rods and a 1.2 millimeter wide and 22 millimeter long superconducting ribbon was grown using aforementioned method. This superconducting ribbon is shown in FIGS. 2 and 3. The ribbon consists of long grains growing almost parallel to the growth direction as is the case with fibers grown with the laser heated pedestal growth method. Most of the grains initiated near the platinum wires and grew inward at a low angle to the ribbon transverse axis. A typical grain extended over a length of several millimeters.

A backscattered electron micrograph of a cross-section of a ribbon is presented in FIG. 4. The ribbon consists of three phases: (1) $Bi_2Sr_2CaCu_2O_x$, which appears grey on the micrograph. This phase, which is the major phase, is superconducting, (2) $SrCaCu_2O_4$, which appears black on the micrograph, and (3) A light grey phase with the composition of $Bi_5Sr_4CaCu_3O_x$. Heat treating a ribbon in air at the temperature of 800° C. for 26 h resulted in much of the non-superconducting phases reacting together to form more of the superconducting phase. A micrograph of a cross-section of an annealed ribbon is presented in FIG. 5. The black phase occupies less of the ribbon volume. However, the sample was incompletely reacted, probably due to the large initial size of the grains and the short annealing time. A resistance versus temperature curve of an annealed ribbon is given in FIG. 6. The onset of the superconductivity is at 91K, and zero resistivity obtained at 83K.

The fact that the ribbon incorporates phases other than the superconducting phase does not necessarily imply that it is of poor quality. However, the superconducting volume and consequently the overall critical current is reduced. It was recently shown that an overnight annealing of multiphase superconductor fibers prepared by the LHPG method significantly increased the amount of superconducting phase and improved their properties substantially, even though they were still not completely single phase.

Observations of ribbons under steady state growth conditions, and of rapidly disconnected growth interface (obtained by quickly raising the growing ribbon free from the molten zone) (FIG. 3), indicated that the solidification isotherm is generally horizontal in the center of the ribbon and slants downward near the wire supports where heat dissipation is more rapid due to thermal conduction in the wire. Since the grains tend to grow normal to the isotherm, this can explain why the grains initiated near the wires, where the isotherms were oblique, grew at a low angle to the ribbon axis. Since the individual grains (crystals) tend to grow straight, they continued growing all the way to the center, where they met grains growing from the opposite direction. This fact makes possible the tailoring of the grain orientation in the ribbon by altering the thermal geometry of the system. The use of other types of support wires should also be possible. Oxide fibers such as sapphire and $SrTiO_3$, and gold, iridium or metal alloy wires might also be useful and those with lower thermal conductivity should lead to flatter interface shapes and more parallel grain alignment.

Based on the results of a former study on the influence of growth rate on fiber structure, we have concluded that the ribbons in these experiments were grown at too high a growth rate. It is believed that the thermal gradient in this configuration is lower than in the standard fiber growth geometry, and a growth rate lower than 10 mm/h will be needed if a completely single phase ribbon is desired. Since the thermal gradient was higher close to the wires, most of the volume in this region was single phase, as can be seen in FIG. 4.

It should further be apparent to those skilled in the art that various changes in form and details of the invention as shown and described may be made. It is intended that such changes be included within the spirit and scope of the claims appended hereto.

What is claimed is:

1. A method of fabricating a ribbon of Bi-based superconducting material comprising the steps of:
   providing a source material having an areal cross-section and an overall of composition of $Bi_2Sr_2CaCu_2O_8$;
   placing two substantially parallel platinum wires along sides of said source material;
   melting a top of said source material so that a liquid film of melted source material is created a said top of said source material, said melted source material being supported by said platinum wires;
   pulling said wires in a direction generally vertical to said source material to pull melted source material supported by said wires into a colder region where said melted source material solidifies to form a solid ribbon of superconducting material.

2. The method as in claim 1 including the step of annealing said Bi-based superconducting ribbon in air for a predetermined amount of time to reduce the quantity of nonsuperconducting phases in said superconducting ribbon.

3. The method as in claim 1 including the step of controlling the growth rate to reduce the quantity of nonsuperconducting phases in said Bi-based superconducting ribbon.

4. The method as in claim 1 including the step of altering the thermal geometry to control the grain orientation in said Bi-based superconducting ribbon.

5. The method as in claim 1 including the step of twisting said parallel wires around each other to initiate the suspension of said film.

* * * * *

UNITED STATES PATENT AND TRADEMARK OFFICE
CERTIFICATE OF CORRECTION

PATENT NO. : 5,122,504
DATED : June 16, 1992
INVENTOR(S) : Gazit, et al.

It is certified that error appears in the above-indentified patent and that said Letters Patent is hereby corrected as shown below:

At column 1, line 4, insert --This invention was made with Government support under Contract No. 9-XF8-7082W-1 awarded by the Department of Energy. The Government has certain rights in this invention.--

Signed and Sealed this

Eighteenth Day of April, 1995

Attest:

BRUCE LEHMAN

*Attesting Officer*

*Commissioner of Patents and Trademarks*